(12) United States Patent
Kapusta et al.

(10) Patent No.: US 8,004,436 B2
(45) Date of Patent: Aug. 23, 2011

(54) DITHERING TECHNIQUE FOR REDUCING DIGITAL INTERFERENCE

(75) Inventors: Ronald A. Kapusta, Waltham, MA (US); Jianrong (Pierce) Chen, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/248,370

(22) Filed: Oct. 9, 2008

(65) Prior Publication Data

US 2010/0090875 A1    Apr. 15, 2010

(51) Int. Cl.
*H03M 1/20* (2006.01)
(52) U.S. Cl. .......................................... 341/131; 341/155
(58) Field of Classification Search .................. 341/131, 341/161, 155, 162, 122, 152; 375/130
See application file for complete search history.

(56) References Cited

U.S. PATENT DOCUMENTS

| | | | |
|---|---|---|---|
| 4,060,792 A * | 11/1977 | van Heyningen | 367/126 |
| 4,812,846 A | 3/1989 | Noro | |
| 4,857,927 A | 8/1989 | Takabayashi | |
| 4,914,439 A * | 4/1990 | Nakahashi et al. | 341/131 |
| 4,916,449 A | 4/1990 | Kubo et al. | |
| 4,937,576 A * | 6/1990 | Yoshio et al. | 341/131 |
| 5,012,242 A | 4/1991 | Yoshio et al. | |
| 5,187,481 A | 2/1993 | Hiller | |
| 5,259,033 A * | 11/1993 | Goodings et al. | 381/318 |
| 5,793,318 A * | 8/1998 | Jewett | 341/118 |
| 6,094,726 A * | 7/2000 | Gonion et al. | 713/400 |
| 6,173,003 B1 * | 1/2001 | Whikehart et al. | 375/130 |
| 6,449,313 B1 * | 9/2002 | Erzin et al. | 375/259 |
| 7,532,079 B2 * | 5/2009 | Shen et al. | 331/116 FE |
| 7,542,620 B1 * | 6/2009 | Bilbrey et al. | 382/268 |
| 2006/0087463 A1 * | 4/2006 | Wang | 341/120 |
| 2009/0268253 A1 * | 10/2009 | Kudou | 358/3.06 |

FOREIGN PATENT DOCUMENTS

EP    1 248 376    10/2002

OTHER PUBLICATIONS

Dong et al., "Dithering Effect Simulation for Sigma-Delta Modulators with the Presence of Thermal Noise", Canadian Conference on Electrical and Computer Engineering, IEEE, May 1998.
International Search Report dated Mar. 18, 2010, in counterpart international application No. PCT/US2009/059963.

* cited by examiner

*Primary Examiner* — Joseph Lauture
(74) *Attorney, Agent, or Firm* — Kenyon & Kenyon LLP

(57) ABSTRACT

The invention is directed to a circuit and method for equalizing digital interference. A digital interference equalizing circuit may include a signal clipping unit, receiving a digital signal and clipping the digital signal based upon a clipping function, and a dithering unit adding dither to the clipped digital signal. A digital interference equalizing circuit may also include a noise detection circuit, detecting the normal activity level in a digital signal which may then be used to scale the dither added to the digital signal.

19 Claims, 6 Drawing Sheets

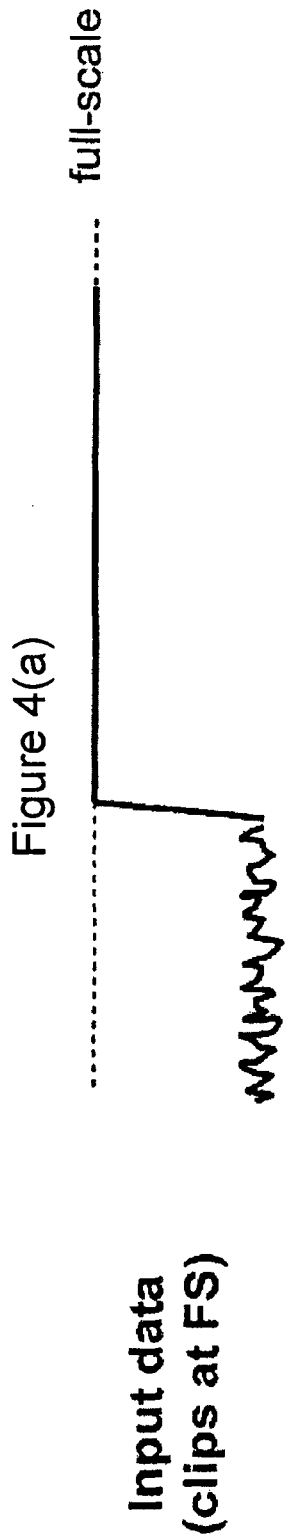
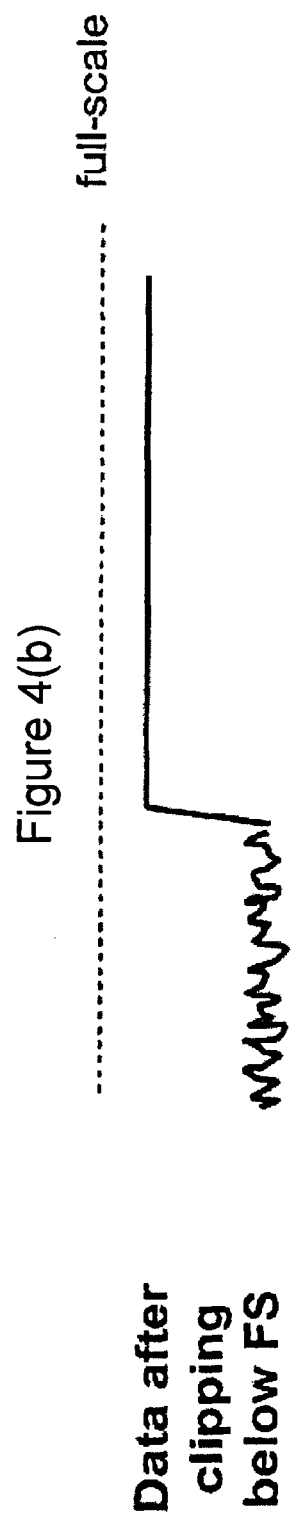
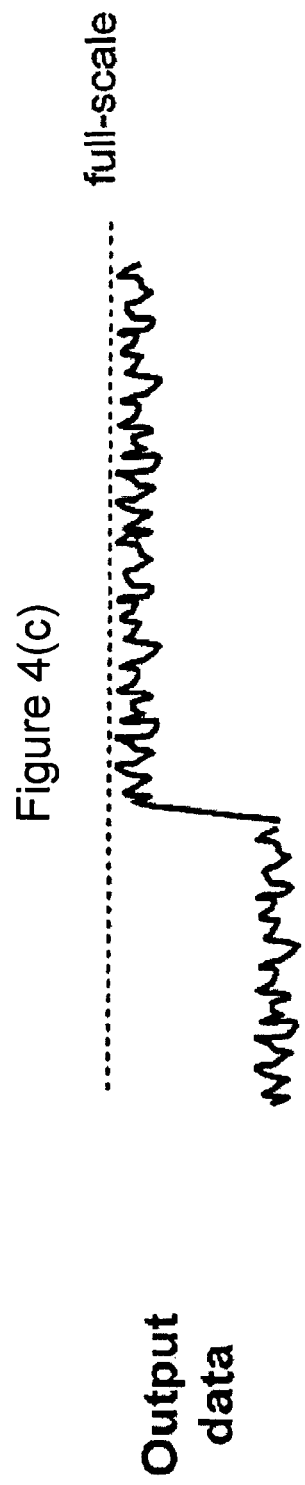

DITHERING TECHNIQUE FOR REDUCING DIGITAL INTERFERENCE

BACKGROUND

During high speed data transmission system components often radiate energy can couple or interfere with other system components and introduce signal corruption. Energy may also couple to sensitive circuits through other means. For example, energy may couple through ground or supply networks. The interference or "kick-back" caused by the coupled energy can cause problems in high speed data converters, such as analog-to-digital converters (ADCs) and digital-to-analog converters (DACS).

FIG. 1 illustrates an exemplary digital signal and the corresponding interference or kickback. As seen in FIG. 1, when the digital signal is at a low-level, some relatively constant number of bits are toggling each cycle. The toggling could be caused, for example, by the energy coupling to the system. In this state, as seen in FIG. 1, the kickback is proportional to a thermal noise of the system. However, in the large signal condition, the digital signal "saturates" at full scale. That is, the digital representation of a signal at full scale is simply all 1's. In this condition, there is no kick-back, as no bits are toggling from cycle to cycle. Accordingly, in a conventional system, because the amount of kick-back is data dependent, there is a data-dependent signature in the output data.

In many systems, having a small amount of consistent noise is tolerable. For example, in audio or video systems, random noise is preferable to deterministic or data dependent-noise, because when noise is data-dependent, the noise becomes much more obvious.

Accordingly, there is a need to equalize the digital interference over all operating conditions during data transmission so that the interference is not data dependent.

BRIEF DESCRIPTION OF THE DRAWINGS

FIG. 4(a) illustrates an exemplary input data signal input to a digital interference equalizing circuit;

FIG. 4(b) illustrates an exemplary data signal output from a signal clipping unit;

FIG. 4(c) illustrates an exemplary data signal output from a digital interference equalizing circuit.

DETAILED DESCRIPTION

In accordance with one embodiment of the present invention, a digital interference equalizing circuit may include a signal clipping unit that receives a digital signal and clips the digital signal based upon a clipping function and a dithering unit that adds dither to the clipped digital signal. The digital interference equalizing circuit does not reduce or remove interference, rather, the digital interference equalizing circuit attempts to make the interference largely constant over all operating conditions, even in a saturated condition, thereby reducing data dependent interference.

Figure 1:
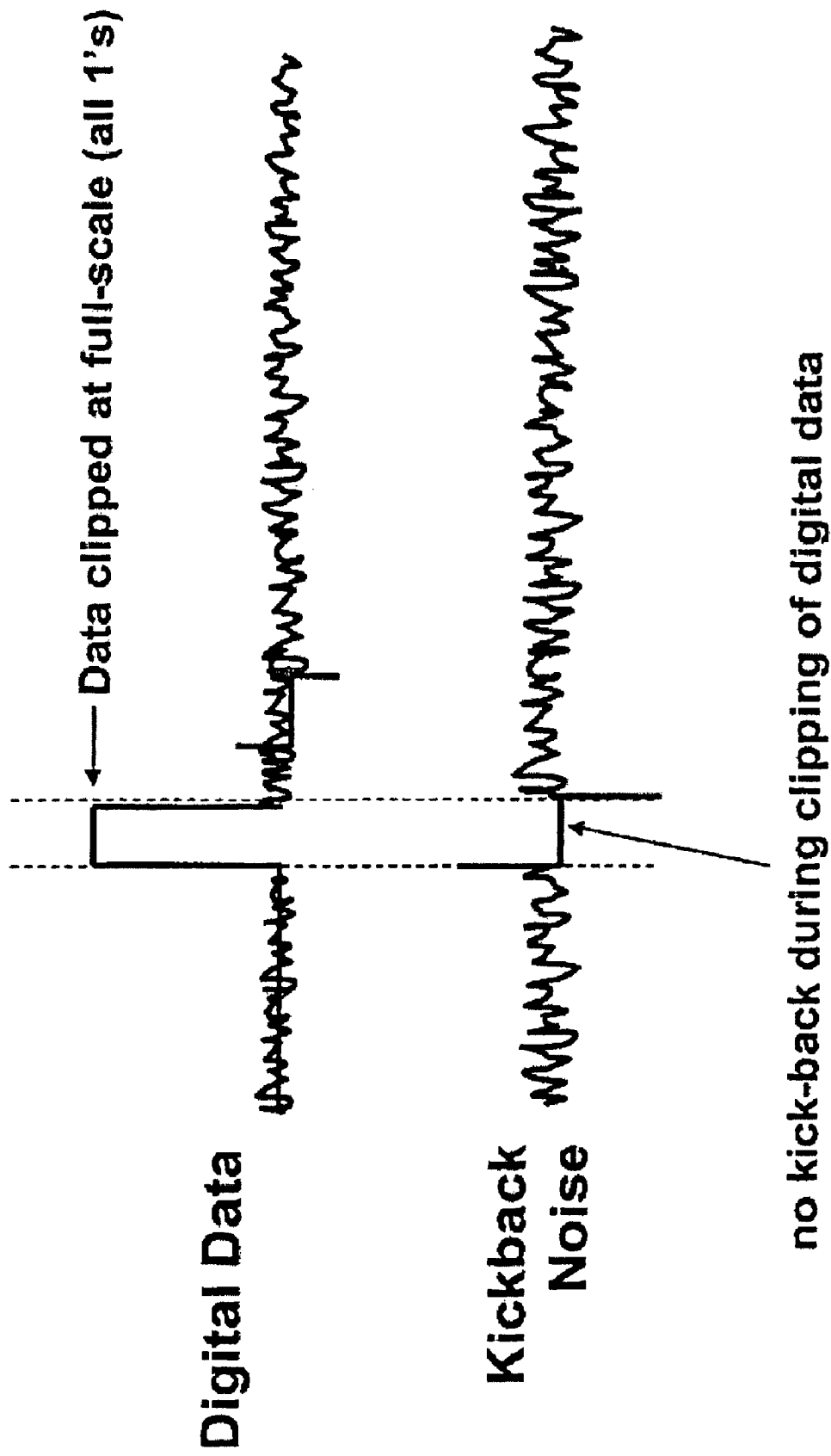
FIG. 1 illustrates an exemplary digital signal and a corresponding kick-back noise.
Figure 2:
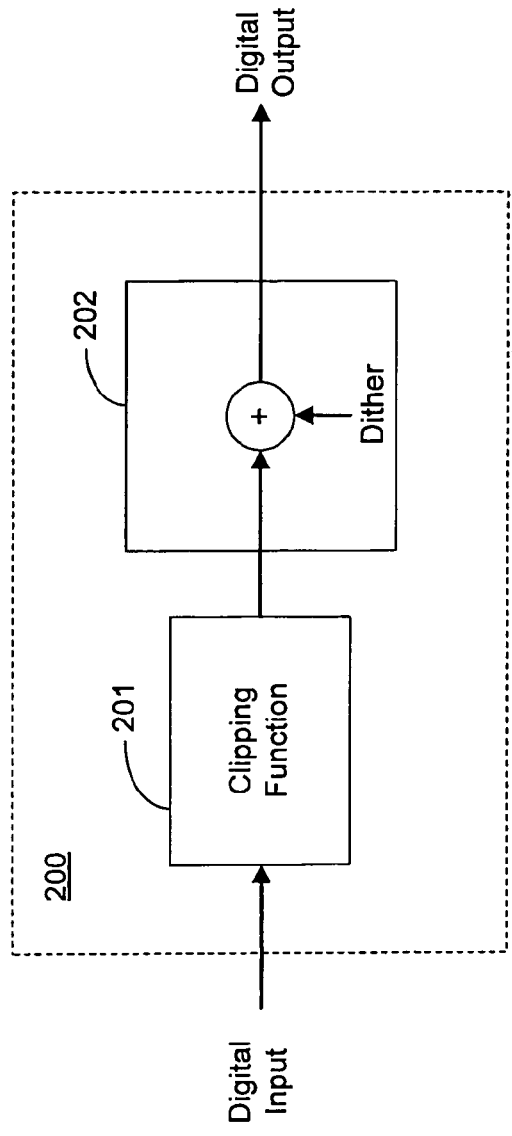
FIG. 2 illustrates an exemplary digital interference equalizing circuit in accordance with an embodiment of the present invention.

FIG. 2 illustrates an embodiment of a digital interference equalizing circuit 200. The equalizing circuit 200 may include a clipping unit 201 and a dithering unit. The clipping unit, which has a clipping function, receives a digital signal and outputs a clipped digital signal to a dithering unit 202. The dithering unit 202 adds a dither to the clipped digital signal and outputs the digital signal.

The clipping unit 201 may clip a n-bit digital signal at some level below full-scale, that is, when the digital signal is all 1's, and/or at some level above zero-scale, that is, when the digital signal is all 0's. By clipping the digital signal to some level lower than full scale, the clipping provides "room" to add dither and keep the resultant signal within the dynamic range of the digital signal.

The clipping unit 201 can be controlled by a clipping function, which may cause the clipping unit 201, for example, to always clip the input digital signal or selectively clip the input digital signal. For example, the clipping function may cause the clipping unit to clip the input digital signal only when the input digital signal is at either full-scale or zero-scale and to pass through the input digital signal when the input digital signal is less than full-scale and/or greater than zero-scale.

The dithering unit 202 adds noise to the digital signal. For the purposes of the present invention, the source of the noise signal is immaterial. For example, the dithering unit can be designed to add dither from a linear-feedback shift register (lfsr) pseudo-random noise generator or a Gaussian distributed pseudo-random noise generator or the dithering unit 202 can add dither based upon a pre-determined pattern. The noise signal may have a maximum amplitude (a) that does not exceed the room generated between the clipped value and the full scale value of the digital signal.

For example, if the digital signal is a standard 4-bit signal, the full scale signal would be 1111, and the zero-scale signal would be 0000. If the dither were added at full scale, and if the dither to be added to the digital signal, for example, toggles the least significant bit, any dither added to the full scale signal would be clipped. That is, a 4-bit signal at 1111 cannot be made any bigger without adding a $5^{th}$ bit. Accordingly, the clipping unit 201 may clip the digital signal, for example, at 1110 so that dither can be added to the digital signal without the dither being clipped. For example, the digital output signal may toggle between 1110, 1110 and 1101 or the digital output signal could toggle between 1110 and 1111. In this example, the maximum amplitude ($\alpha$) of the dither is 1-bit and the output of the dithering unit varies by ±1-bit, i.e., ±$\alpha$. However, $\alpha$ may be any number of bits depending upon the number of bits in the input digital signal and the number of bits clipped by the clipping unit 201.

The clipping unit 201 could also clip the zero-scale digital signal at, for example, 0001 and the dithering unit 202 could then add dither to the clipped zero-scale signal.

The digital signal may also be coded. One example of a code for a digital signal is a gray code. A gray code is a binary numeral system where two successive values differ in only one digit. Table 1 illustrates following is a typical 4-bit gray code:

TABLE 1

4-Bit Gray Code

| 0  | 0000 |
|----|------|
| 1  | 0001 |
| 2  | 0011 |
| 3  | 0010 |
| 4  | 0110 |
| 5  | 0111 |
| 6  | 0101 |
| 7  | 0100 |
| 8  | 1100 |
| 9  | 1101 |
| 10 | 1111 |
| 11 | 1110 |
| 12 | 1010 |
| 13 | 1011 |
| 14 | 1001 |
| 15 | 1000 |

Accordingly, in a typical 4-bit gray code signal, the full scale signal would be 1000. Accordingly, in this example, the clipping unit 201 could clip the signal at 1001. The dithering unit 202 could than add dither to the digital signal to cause the output to toggle, for example, between 1001, 1000 and 1011, or simply between 1001 and 1000.

While the above examples use a 4-bit digital code, the digital signal may have any number of bits.

Accordingly, one benefit of the digital interference equalizing circuit is, for example, that by keeping the digital activity on the output digital signal constant, regardless of the signal level, activity should appear constant and not have a data-dependent signature. That is, by making the interference constant, the interference appears as random noise and no longer has a data dependent signature. In many applications, such as in video or audio signals, random noise is preferable over deterministic or data-dependent noise.

Figure 3:
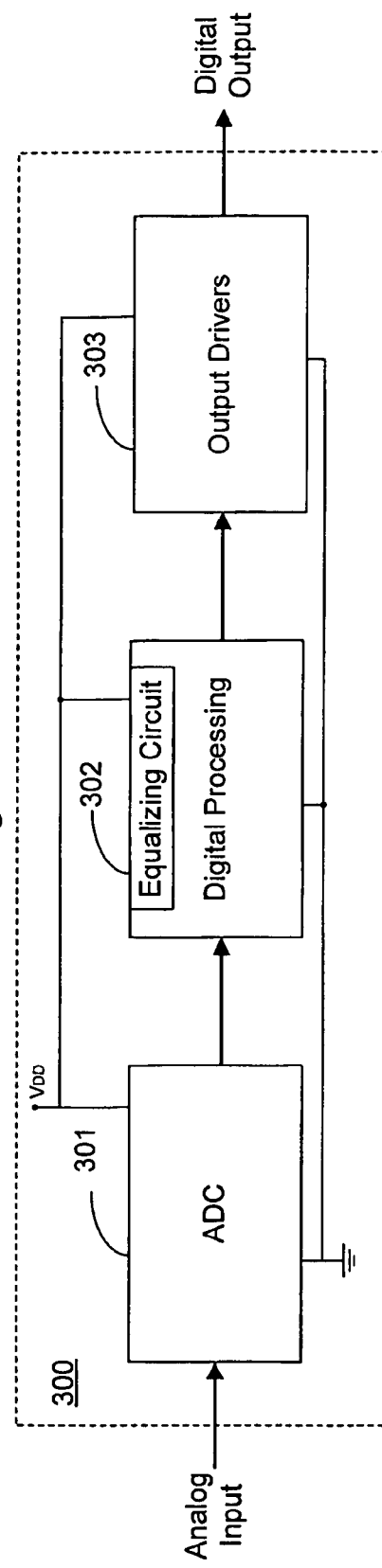
FIG. 3 illustrates an exemplary system utilizing a digital interference equalizing circuit.

FIG. 3 illustrates an equalizing circuit in an exemplary high-speed data converter system 300. As seen in FIG. 3, high-speed data converter system 300 receives an analog input, which is sent to an analog to digital converter (ADC) 301. The ADC outputs a digital signal to a digital processing unit 302, which processes the signal according to the requirements of the system, and includes an equalization circuit in accordance with an embodiment of the present invention. The digital processing unit 302 outputs the processed digital signal to an output driver 303 which outputs the digital signal, and which may include, for example, a buffer. FIG. 3 also schematically shows an exemplary voltage ground network through which the kickback phenomena may appear.

FIGS. 4(*a-c*) illustrate exemplary digital signals. FIG. 4(*a*) illustrates an exemplary digital signal which may be input to a digital interference equalizing circuit. As seen in FIG. 4(*a*), when the input digital signal is below full scale, noise, i.e., digital kick-back, is present in the digital signal. Further, when the input digital signal is at full scale, i.e., all 1's, there is no digital kick-back. FIG. 4(*b*) illustrates a exemplary digital signal output from a clipping unit. As seen in FIG. 4(*b*), the exemplary digital signal is clipped below full-scale. FIG. 4(*c*) illustrates the exemplary digital signal output from a dithering unit. As seen in FIG. 4(*c*) dither is added to the exemplary digital signal where the input digital signal was at full scale. Further, as seen in FIG. 4(*c*), the digital signal, with the added dither, does not exceed full scale, because the input digital signal was clipped by the clipping unit.

Figure 5:
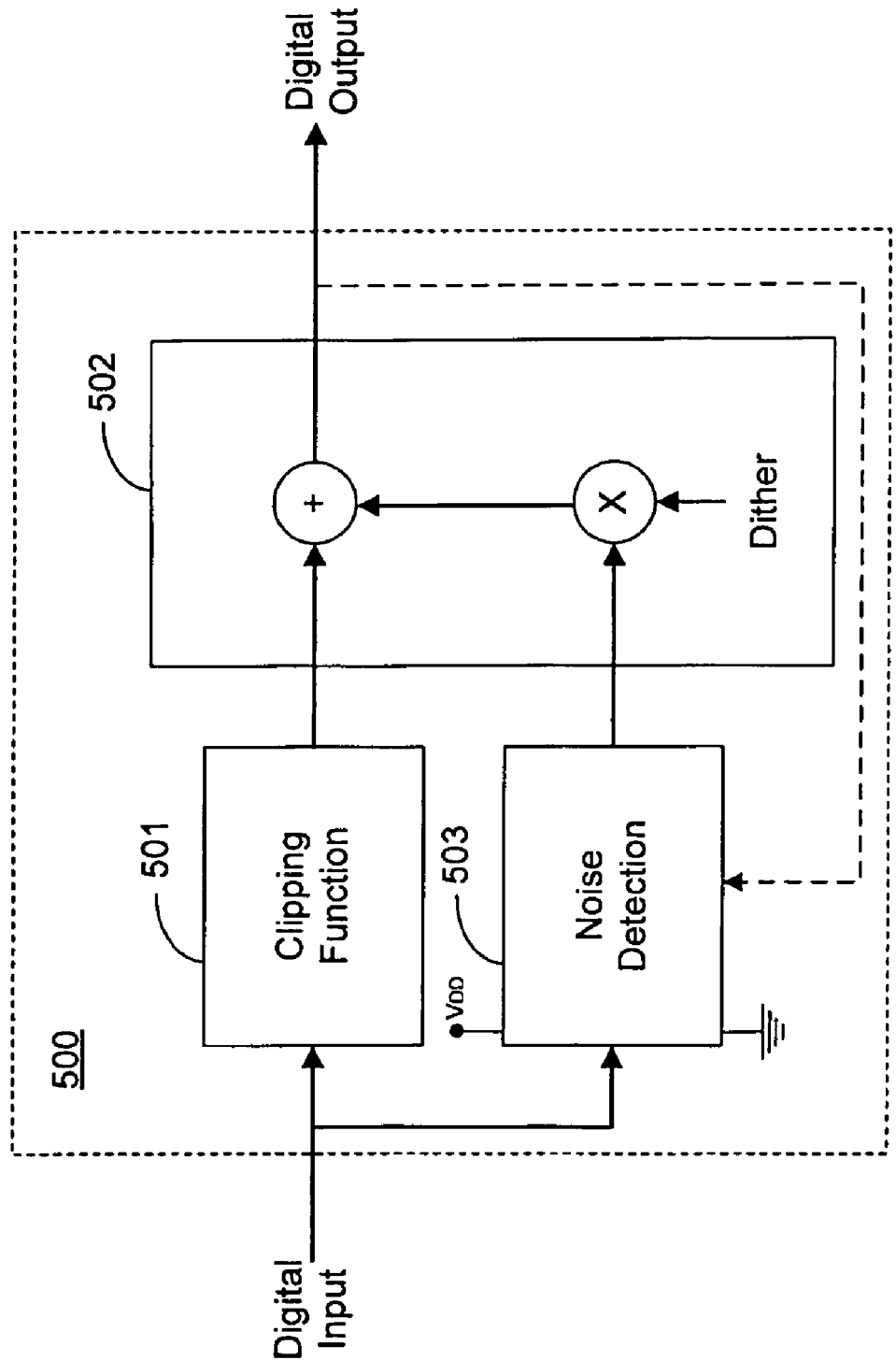
FIG. 5 illustrates another exemplary system utilizing a digital interference equalizing circuit.

FIG. 5 illustrates another embodiment of a digital interference equalizing circuit. FIG. 5 includes an equalizing circuit 500, receiving a digital signal at a clipping unit 501. The clipping unit 501, which has a clipping function, outputs the digital signal to a dithering unit 502. A noise detection unit 503 detects the normal activity of the digital input signal. The dithering unit 502 can then scale a dither based upon the detected normal activity, adds the scaled dither to the clipped digital signal and outputs the digital signal.

The noise detection unit 503 detects the normal activity of the digital signal and controls a scaling of the dither added by the dithering unit 502. For example, the noise detection unit can detect when the digital input signal is at full scale and/or zero-scale, and cause the dithering unit 502 to only add dither to the digital signal when the input digital signal is at full scale and/or zero-scale. One benefit of this embodiment, for example, is that the dither is not needlessly added to the digital signal when there is already digital kick-back on the digital signal. That is, the noise detecting unit 503 can cause the dithering unit to only add dither to the digital signal when the input digital signal is at full-scale or zero-scale, by changing the scale of the signal output by the dithering unit 502. The noise detection unit may also measure the noise on the output signal, the ground network and/or the voltage network and scale the dither added to the output signal to equalize the amount of noise on the output signal.

The noise detection unit 503 can also scale the dither added by the dithering unit 502 to make the activity on the digital output signal constant. For example, when a level of noise detected on input digital signal is below an expected value, the noise detection unit 503 can increase the scale of the dither provided by the dithering unit 502 to keep the level of noise on the digital output signal constant. Accordingly, another benefit of this embodiment is that the dither can be intelligently added to the digital signal by increasing or decreasing the scale of the dither being added based upon the output of the noise detection unit 503.

Figure 6:
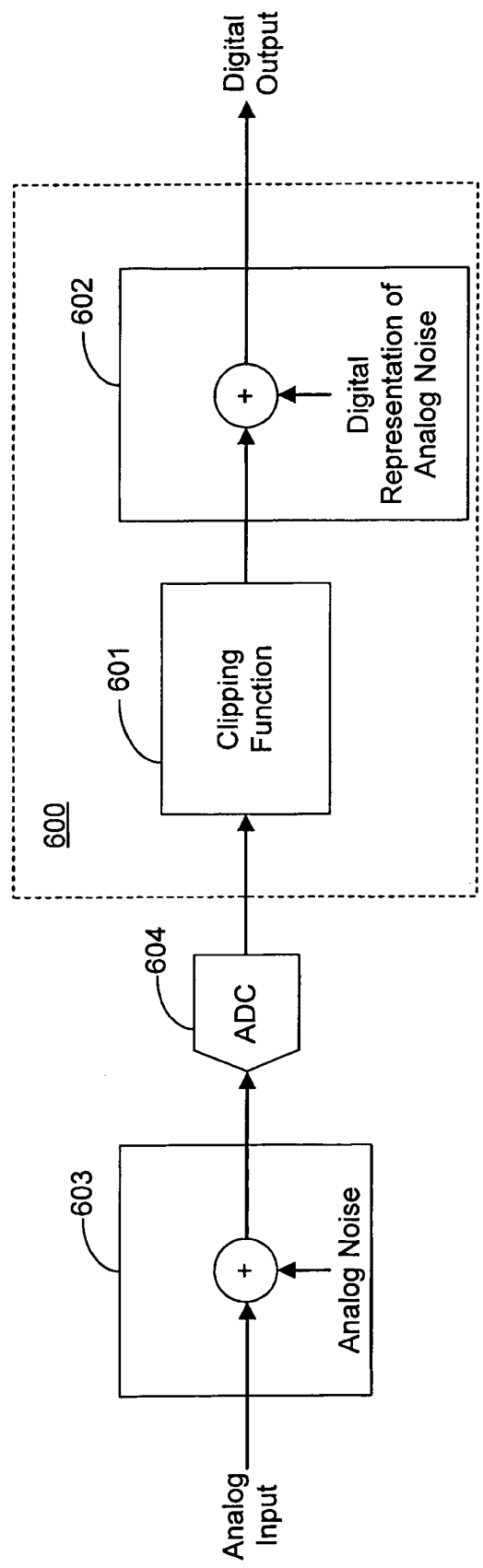
FIG. 6 illustrates yet another exemplary system utilizing a digital interference equalizing circuit.

FIG. 6 illustrates yet another embodiment of a digital interference equalizing circuit, in this instance, interfacing with an analog to digital converted (ADC). FIG. 6 includes an analog noise unit 603, receiving an analog input signal and adding noise larger than an expected thermal noise of the system into the analog input signal. The analog noise unit 603 outputs the analog signal with added noise to an ADC, which converts the analog signal to a digital signal and sends the digital signal to an equalizing circuit 600. Equalizing circuit 600 receives the digital signal at a clipping unit 601. The clipping unit 601, which has a clipping function, outputs the digital signal to a dithering unit 602. The dithering unit 602 then adds a dither to the received digital signal based upon a digital representation of the analog noise added to the input analog signal by the analog noise unit 603.

One benefit of this embodiment, for example, is that since the noise inserted is known, and larger than the expected thermal noise of the system, the normal digital activity can be approximated and the dither can be appropriately scaled with without the need for a noise detection unit.

The performance of the ADC 604 can be improved using dither, that is, adding an analog noise added to the input before the conversion. The effect of adding the analog noise is to cause the state of the least significant bit of the output digital signal to randomly oscillate between 0 and 1 in the presence of very low levels of input, rather than sticking at a fixed value. Adding analog noise to the analog signal can improve the performance parameters of the ADC, such as improving the linearity of the output.

Figure 7:
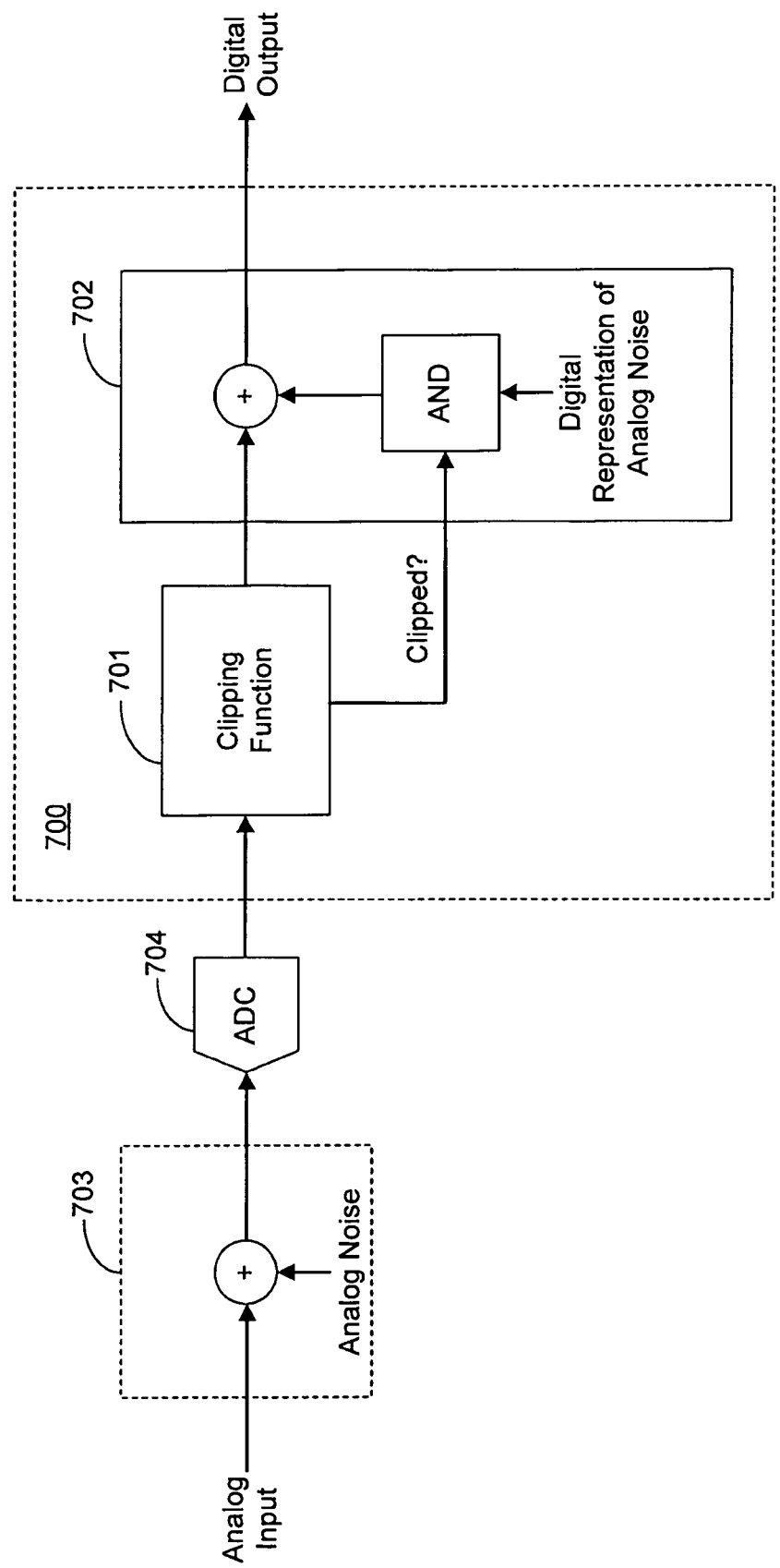
FIG. 7 illustrates a further exemplary system utilizing a digital interference equalizing circuit.

FIG. 7 illustrates a further embodiment of a digital interference equalizing circuit interfacing with an analog to digital converted (ADC). FIG. 7 is similar to FIG. 6, but further illustrates the clipping unit's 701 ability to selectively clip the input digital signal. FIG. 7 includes an analog noise unit 703, receiving an analog input signal and adding inserts noise larger than an expected thermal noise of the system into the analog input signal. The analog noise unit 703 outputs the analog signal with added noise to an ADC, which converts the analog signal to a digital signal and sends the digital signal to the equalizing circuit 700. Equalizing circuit 700 receives the digital signal at a clipping unit 701. The clipping unit 701, which has a clipping function, outputs the digital signal to a dithering unit 702. The dithering unit 702 then adds a dither to the received digital signal based upon a digital representation of the analog noise added to the input analog signal by the analog noise unit 703.

In this embodiment, the clipping unit also sends a signal to the dithering unit 702 indicating when the clipping unit has clipped the digital signal. As discussed above, the clipping function can cause the clipping unit 703 to selectively clip the digital signal, based upon the input digital signal. For example, the clipping function may cause the clipping unit to clip the digital signal only when the input digital is at full scale. The dithering unit 702 may then add dither to the digital signal when the clipping unit 703 indicates that the digital signal has been clipped.

Several embodiments of the invention are specifically illustrated and/or described herein. However, it will be appreciated that modifications and variations of the invention are covered by the above teachings and within the purview of the appended claims without departing from the spirit and intended scope of the invention.

We claim:

1. A digital interference equalizing circuit, comprising:
   a signal clipping unit, receiving a digital signal and clipping the digital signal based upon a clipping function; and
   a dithering unit adding dither to the clipped digital signal and outputting the clipped digital signal with the added dither, where a maximum dither amplitude corresponds to the amount of room between full-scale and the maximum value of the clipped digital signal.

2. The digital interference equalizing circuit according to claim 1, wherein the dithering unit adds dither to the clipped digital signal based upon a linear-feedback shift register pseudo-random noise generator.

3. The digital interference equalizing circuit according to claim 1, wherein the dithering unit adds dither to the clipped digital signal based upon a Gaussian distributed pseudo-random noise generator.

4. The digital interference equalizing circuit according to claim 1, wherein the dithering unit adds dither to the clipped digital signal based upon deterministic pattern.

5. The digital interference equalizing circuit according to claim 1, wherein the clipping function causes the signal clipping unit to clip the signal to a level below full scale.

6. The digital interference equalizing circuit according to claim 1, wherein the clipping function causes the signal clipping unit to clip the signal at a level above zero.

7. The digital interference equalizing circuit according to claim 1, wherein the clipping function causes the signal clipping unit to only clip the input digital signal when the input digital signal is at full scale.

8. The digital interference equalizing circuit according to claim 1, wherein the clipping function causes the signal clipping unit to only clip the input digital signal when the input digital signal is at zero scale.

9. The digital interference equalizing circuit of claim 1, wherein the dithering unit adds a digital quantity to a predetermined number of the least significant bits of the clipped digital signal, wherein the predetermined number of the least significant bits is less than the total number of bits of the clipped digital signal.

10. A digital interference equalizing circuit, comprising:
    a signal clipping unit, receiving a digital input signal and clipping the digital input signal to produce a clipped digital signal;
    a noise detector, detecting a noise level of the unclipped digital input signal; and
    a dithering unit adding dither to the clipped digital signal based upon the detected noise level, and outputting the clipped digital signal with the added dither.

11. The digital interference equalizing circuit according to claim 10, wherein the noise detector detects noise on the output digital signal and adds dither responsively to such detection.

12. The digital interference equalizing circuit according to claim 10, wherein the noise detector detects noise on a voltage supply network and/or a ground network and adds dither responsively to such detection.

13. A digital interference equalizing circuit, comprising:
    a signal clipping unit, receiving a digital input signal and clipping the digital input signal to produce a clipped digital signal;
    a noise detector, detecting a noise level of the unclipped digital input signal; and
    a dithering unit adding dither to the clipped digital signal based upon the detected noise level, and outputting the clipped digital signal with the added dither, wherein the noise detector controls the dithering unit to only add dither to the digital signal when the unclipped digital input signal is saturated.

14. A interference equalizing circuit, equalizing interference in a system, comprising:
    an analog noise unit adding analog noise, larger than an expected thermal noise of the system, to an analog input;
    an analog-to-digital converter, receiving the analog input with the added analog noise and converting the analog input with the added analog noise to a digital signal;
    a signal clipping unit clipping the digital signal; and
    a dithering unit adding dither to the clipped digital signal based upon a digital representation of the added analog noise.

15. The interference equalizing circuit according to claim 14, wherein the signal clipping unit only clips the digital signal when the digital signal is at full scale.

16. A method of equalizing interference, comprising:
    clipping a received digital input signal, by a signal clipping unit, to produce a clipped digital signal;
    detecting, by a noise detector, a noise level of the unclipped digital input signal;
    adding dither, by a dithering unit, to the clipped digital signal based upon the detected noise level; and
    outputting the clipped digital signal with the added dither.

17. The method of claim 16, further comprising detecting a normal activity level of the digital signal, and the dither added to the digital signal is based upon the detected normal activity level.

18. A method for equalizing interference, comprising:
    adding analog noise, larger than an expected thermal noise, to an analog signal;
    converting the analog signal with the added analog noise to a digital signal;
    clipping the digital signal at a level below full scale;
    adding dither to the clipped digital signal based upon a digital representation of the analog noise; and
    outputting the digital signal.

19. A method of equalizing interference, comprising:
receiving a digital signal at a signal clipping unit and clipping the digital signal based upon a clipping function;
adding dither to the clipped digital signal by a dithering unit, wherein a maximum dither amplitude corresponds to the amount of room between full-scale and the maximum value of the clipped digital signal; and
outputting the clipped digital signal with the added dither.

* * * * *